(12) United States Patent  (10) Patent No.: US 11,893,944 B2
Ko et al.  (45) Date of Patent: Feb. 6, 2024

(54) DISPLAY DEVICE WITH REDUCED DISCONTINUITY OF IMAGE AT BOUNDARY BETWEEN SENSOR REGION AND DISPLAY REGION AND METHOD OF DRIVING THE SAME

(71) Applicant: SAMSUNG DISPLAY CO., LTD., Yongin-si (KR)

(72) Inventors: Yoo Min Ko, Yongin-si (KR); Dong Hyun Kim, Yongin-si (KR); Dong Hwan Shim, Yongin-si (KR); Seung Chan Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/996,313

(22) Filed: Aug. 18, 2020

(65) Prior Publication Data

US 2021/0056913 A1  Feb. 25, 2021

(30) Foreign Application Priority Data

Aug. 21, 2019 (KR) .................. 10-2019-0102548

(51) Int. Cl.
*H10K 59/121* (2023.01)
*G09G 3/3208* (2016.01)
(Continued)

(52) U.S. Cl.
CPC ......... *G09G 3/3275* (2013.01); *G06F 1/1605* (2013.01); *G06F 1/1686* (2013.01);
(Continued)

(58) Field of Classification Search
CPC .............. G09G 3/3275; G09G 3/3208; G09G 2320/0626; G06F 1/1605; H01L 27/3218; H01L 27/326
See application file for complete search history.

(56) References Cited

U.S. PATENT DOCUMENTS 10,327,308 B2  6/2019 Gagne-Keats
10,817,018 B1 * 10/2020 Shao .................. G06F 1/1637
(Continued)

FOREIGN PATENT DOCUMENTS

CN  209056269 U  *  7/2019  .............. G09G 3/20
KR  1020210027628 A  3/2021

OTHER PUBLICATIONS

Zhang, Machine Translation of Foreign Patent Document CN 209056269U, Terminal Screen, screen construction and terminal, Jul. 2, 2019, Google Patents, pp. 1-26 (Year: 2019).*

*Primary Examiner* — Stephen G Sherman
(74) *Attorney, Agent, or Firm* — CANTOR COLBURN LLP

(57) ABSTRACT

A display device includes a substrate, a display panel including a first display region having first pixels, a second display region having second pixels, and a third display region located between the first and second display regions and having third pixels, and a component disposed between the substrate and the display panel and which overlaps the second display region in a plan view. The first and third pixels are disposed at a first density in the first display region and the third display region, respectively, and the second pixels are disposed at a second density smaller than the first density in the second display region, and less than all of the third pixels are controlled to emit light during a predetermined display period.

11 Claims, 12 Drawing Sheets

(51) Int. Cl.
  *G09G 3/3275* (2016.01)
  *G06F 1/16* (2006.01)
  *H10K 59/35* (2023.01)

(52) U.S. Cl.
  CPC ......... *G09G 3/3208* (2013.01); *H10K 59/121* (2023.02); *H10K 59/353* (2023.02); *G09G 2320/0626* (2013.01)

(56) References Cited

U.S. PATENT DOCUMENTS

| | | | |
|---|---|---|---|
| 11,294,422 B1* | 4/2022 | Srikanth | H04N 5/217 |
| 2015/0083915 A1* | 3/2015 | Nakata | G01J 1/1626 |
| | | | 250/208.2 |
| 2017/0124942 A1* | 5/2017 | Evans, V | G06F 1/1684 |
| 2018/0196475 A1 | 7/2018 | Bao et al. | |
| 2019/0310724 A1* | 10/2019 | Yeke Yazdandoost | ...................... |
| | | | G02F 1/13338 |
| 2020/0005704 A1* | 1/2020 | Tong | G09G 3/2003 |
| 2020/0034100 A1* | 1/2020 | Fan | H01L 27/3244 |
| 2020/0312832 A1* | 10/2020 | Chi | H01L 27/3218 |
| 2020/0411607 A1* | 12/2020 | Jian | H01L 27/3218 |
| 2021/0065620 A1 | 3/2021 | Yang et al. | |

\* cited by examiner

DP: DP1, DP2

DISPLAY DEVICE WITH REDUCED DISCONTINUITY OF IMAGE AT BOUNDARY BETWEEN SENSOR REGION AND DISPLAY REGION AND METHOD OF DRIVING THE SAME

This application claims priority to Korean patent application number 10-2019-0102548 filed on Aug. 21, 2019, and all the benefits accruing therefrom under 35 U.S.C. § 119, the content of which in its entirety is herein incorporated by reference.

BACKGROUND

Field of Invention

Various exemplary embodiments of the present disclosure relate to a display device and a method of driving the same.

Description of Related Art

A flat panel display device overcomes the drawback of a cathode ray tube and thus advantageously has reduced weight and volume. Examples of the flat panel display device include a liquid crystal display ("LCD"), a field emission display ("FED"), a plasma display panel ("PDP"), an organic light emitting display device and others. Among the flat panel display devices, the organic light emitting display device displays an image using an organic light emitting diode that generates light by recombination of electrons and holes.

As a display region occupies most of a front surface of a mobile terminal or the like, a camera, a proximity sensor, a fingerprint recognition sensor, an illumination sensor, a near infrared sensor or the like overlaps the display region.

SUMMARY

A sensor region overlapping the display region reduces the density of pixels so as to improve transmissivity. In this case, a change in density of the pixels between the sensor region and the display region may be recognized by a user as the discontinuity of an image. Various exemplary embodiments of the present disclosure are directed to a display device which maximizes a display region by arranging sensors on a rear surface of a display panel, and a method of driving the display device.

Furthermore, various exemplary embodiments of the present disclosure are directed to a display device which improves the transmissivity of a sensor region by reducing the density of pixels in the sensor region in which sensors are arranged to overlap each other, and a method of driving the display device.

Furthermore, various exemplary embodiments of the present disclosure are directed to a display device which is capable of reducing the discontinuity of an image at a boundary between a sensor region and a display region by controlling the luminance of the display region around the sensor region, and a method of driving the display device.

According to an exemplary embodiment of the present disclosure, a display device includes a substrate, a display panel including a first display region having first pixels, a second display region having second pixels, and a third display region located between the first and second display regions and having third pixels, and a component disposed between the substrate and the display panel and which overlaps the second display region in a plan view. The first and third pixels are disposed at a first density in the first display region and the third display region, respectively, and the second pixels are disposed at a second density smaller than the first density in the second display region, and less than all of the third pixels are controlled to emit light during a predetermined display period.

In an exemplary embodiment, the second display region may include second unit pixel regions, where each is composed of at least one of the second pixels, and transmissive regions arranged to alternate with the second unit pixel regions, no second pixel being disposed in the transmissive regions.

In an exemplary embodiment, the third display region may include a first group of unit pixel regions and a second group of unit pixel regions arranged to alternate with each other.

In an exemplary embodiment, either of the first group of unit pixel regions and the second group of unit pixel regions may be controlled to emit light, during the predetermined display period.

In an exemplary embodiment, the first group of unit pixel regions may be controlled to emit light during a first display period, the second group of unit pixel regions may be controlled to emit light during a second display period subsequent to the first display period, and the predetermined display period includes the first display period and the second display period.

In an exemplary embodiment, the first display period and the second display period may be separated by an off period during which the display panel is turned off.

In an exemplary embodiment, each of the first display period and the second display period may be a period constituting one frame.

In an exemplary embodiment, the first pixels may be controlled to emit light at a first luminance, and the second pixels and the third pixels may be controlled to emit light at a second luminance.

According to another exemplary embodiment of the present disclosure, a method of controlling a display device including a substrate, a display panel including a first display region having first pixels, a second display region having second pixels, and a third display region located between the first and second display regions and having third pixels, and a component disposed between the substrate and the display panel to overlap the second display region is provided. The method includes receiving image data, determining a region on which the image data is to be displayed, correcting the image data and providing the corrected image data to a corresponding display region. The correcting of the image data includes correcting the image data such that a first group of unit pixel regions of the third display region emits light during a first display period, and correcting the image data such that a second group of unit pixel regions of the third display region emits light during a second display period subsequent to the first display period.

In an exemplary embodiment, the second display region may include second unit pixel regions, where each is composed of at least one of the second pixels, and transmissive regions arranged to alternate with the second unit pixel regions, no second pixel being disposed in the transmissive regions.

In an exemplary embodiment, the first group of unit pixel regions and the second group of unit pixel regions may be arranged to alternate with each other, and each may include at least one of the third pixels.

In an exemplary embodiment, the first display period and the second display period may be separated by an off period during which the display panel is turned off.

In an exemplary embodiment, each of the first display period and the second display period may be a period constituting one frame.

In an exemplary embodiment, the correcting of the image data may further include correcting the image data such that the first pixels emit light at a first luminance for the image data to be displayed on the first display region, and correcting the image data such that the second pixels emit light at a second luminance for the image data to be displayed on the second display region and the third pixels emit light at the second luminance for the image data to be displayed on the third display region.

According to still another exemplary embodiment of the present disclosure, a display device includes a substrate, a display panel including a first display region having first pixels, a second display region having second pixels, and a third display region located between the first and second display regions and having third pixels, and a component disposed between the substrate and the display panel and which overlaps the second display region in a plan view. Transmissivity of the second display region is higher than transmissivity of the first display region, the transmissivity of the first display region is equal to transmissivity of the third display region, and less than all of the third pixels may be controlled to emit light during a predetermined display period.

DETAILED DESCRIPTION

Figure 1:
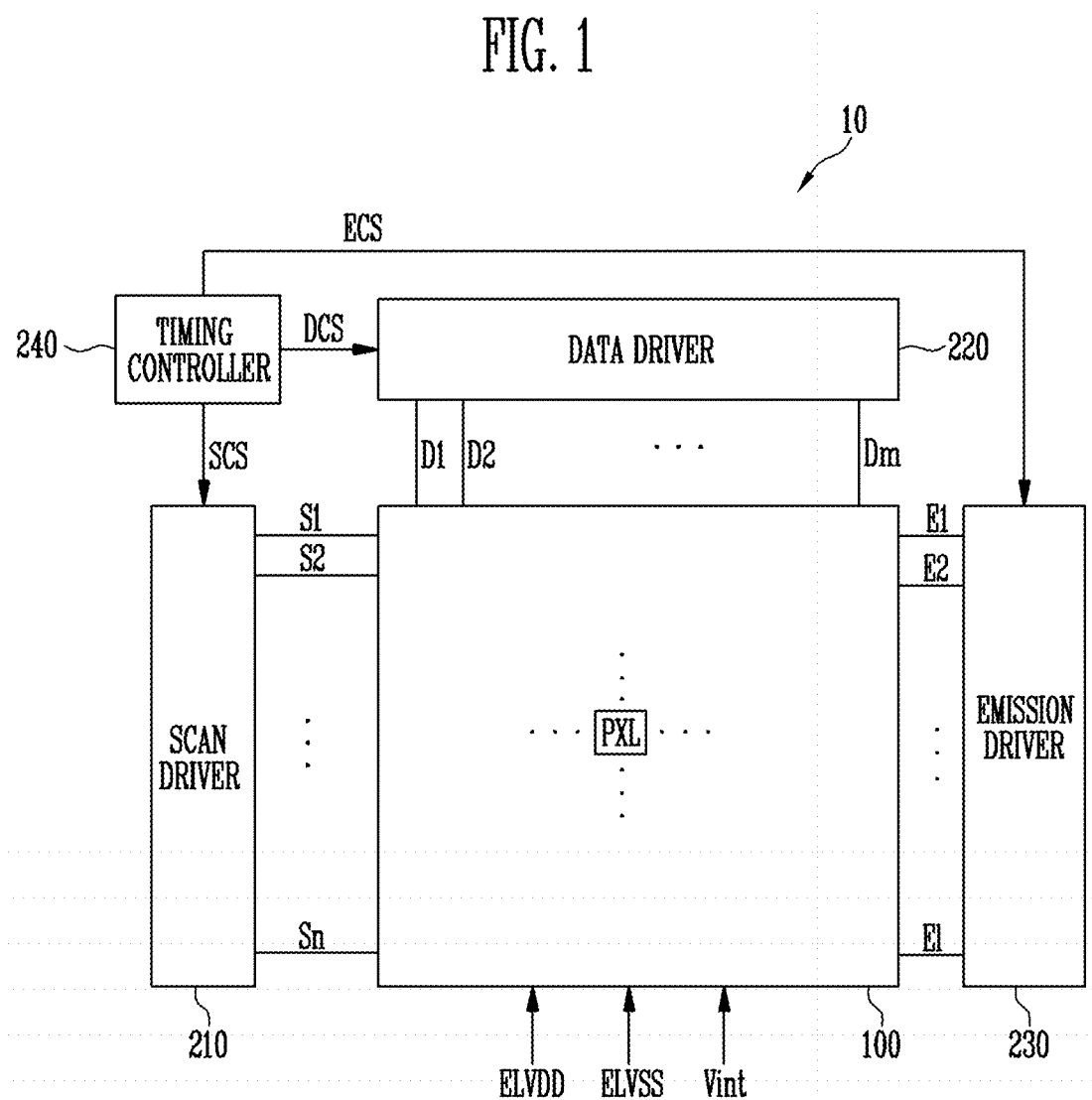
FIG. 1 is a block diagram illustrating an exemplary embodiment of the configuration of a display device in accordance with the present disclosure.

Details of various exemplary embodiments are included in the detailed descriptions and drawings.

Advantages and features of the present disclosure, and methods for achieving the same will be cleared with reference to exemplary embodiments described later in detail together with the accompanying drawings. However, it is to be noted that the present disclosure is not limited to the exemplary embodiments but can be embodied in various other ways. In this specification, "connected/coupled" refers to one component not only directly coupling another component but also indirectly coupling another component through an intermediate component. Furthermore, in the drawings, portions unrelated to the present disclosure have been omitted to clarify the description of the present disclosure, and the same reference numerals are used throughout the different drawings to designate the same or similar components. It will be understood that when an element is referred to as being "on" another element, it can be directly on the other element or intervening elements may be present therebetween. In contrast, when an element is referred to as being "directly on" another element, there are no intervening elements present. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

FIG. 1 is a block diagram illustrating an exemplary embodiment of the configuration of a display device in accordance with the present disclosure.

Referring to FIG. 1, the display device 10 in accordance with an exemplary embodiment of the present disclosure may include a display panel 100 including a plurality of pixels PXL, a scan driver 210, a data driver 220, an emission driver 230, and a timing controller 240.

The timing controller 240 may generate a scan driving control signal SCS, a data driving control signal DCS, and an emission driving control signal ECS, based on signals input from an external device. The scan driving control signal SCS, the data driving control signal DCS, and the emission driving control signal ECS generated from the timing controller 240 may be supplied to the scan driver 210, the data driver 220, and the emission driver 230, respectively.

The scan driving control signal SCS may include a scan start pulse and clock signals. The scan start pulse may control the output timing of a first scan signal, and the clock signals may control the output timing of scan signals.

The data driving control signal DCS may include a source start pulse and clock signals. The source start pulse may control a sampling start time of data, and the clock signals may be used to control a sampling operation.

The emission driving control signal ECS may include an emission start pulse and clock signals. The emission start pulse may control the output timing of a first emission control signal, and the clock signals may control the output timing of emission control signals.

The scan driver 210 may output scan signals in response to the scan driving control signal SCS. The scan driver 210 may supply the scan signals to the scan lines S1 to Sn. The scan signals may be sequentially or simultaneously applied to the scan lines S1 to Sn.

The data driver 220 may supply data signals to the data lines D1 to Dm in response to the data driving control signal DCS. The data signals supplied to the data lines D1 to Dm may be applied to the pixels PXL of a pixel column selected by the scan signal. To this end, the data driver 220 may supply the data signals to the data lines D1 to Dm in synchronization with the scan signals.

The data driver 220 may apply data signals corresponding to image data provided from the external device to the data lines D1 to Dm during a display period in one frame.

The emission driver 230 may supply emission control signals to emission control lines E1 to EI in response to the emission driving control signal ECS. The emission control signals may be sequentially or simultaneously applied to the emission control lines E1 to EI. The pixels PXL receiving the emission control signals through the emission control lines E1 to EI may emit light at a luminance corresponding to the data signals applied from the data driver 220.

The display panel 100 may include a plurality of pixels PXL that are coupled with the data lines D1 to Dm, the scan lines S1 to Sn, and the emission control lines E1 to En. According to a circuit structure of the pixels PXL, a plurality of scan lines may be coupled to one pixel PXL.

The pixels PXL may be supplied with a voltage of a first driving power supply ELVDD and a voltage of a second driving power supply ELVSS from the external device. The voltage of the first driving power supply ELVDD may be set to a value higher than that of the second driving power supply ELVSS. In various embodiments, the pixels PXL may be further supplied with a voltage of an initialization power supply Vint or the like.

When the scan signal is supplied through the corresponding scan line during the display period, each of the pixels PXL may receive the data signal from the corresponding data line. The pixel PXL supplied with the data signal may control, in response to the data signal, a current flowing from the first driving power supply ELVDD to the second driving power supply ELVSS via a light emitting element (not shown). When the emission signal is applied from a corresponding light emitting control line, the light emitting element may generate the light of predetermined luminance in response to the current.

Figure 2:
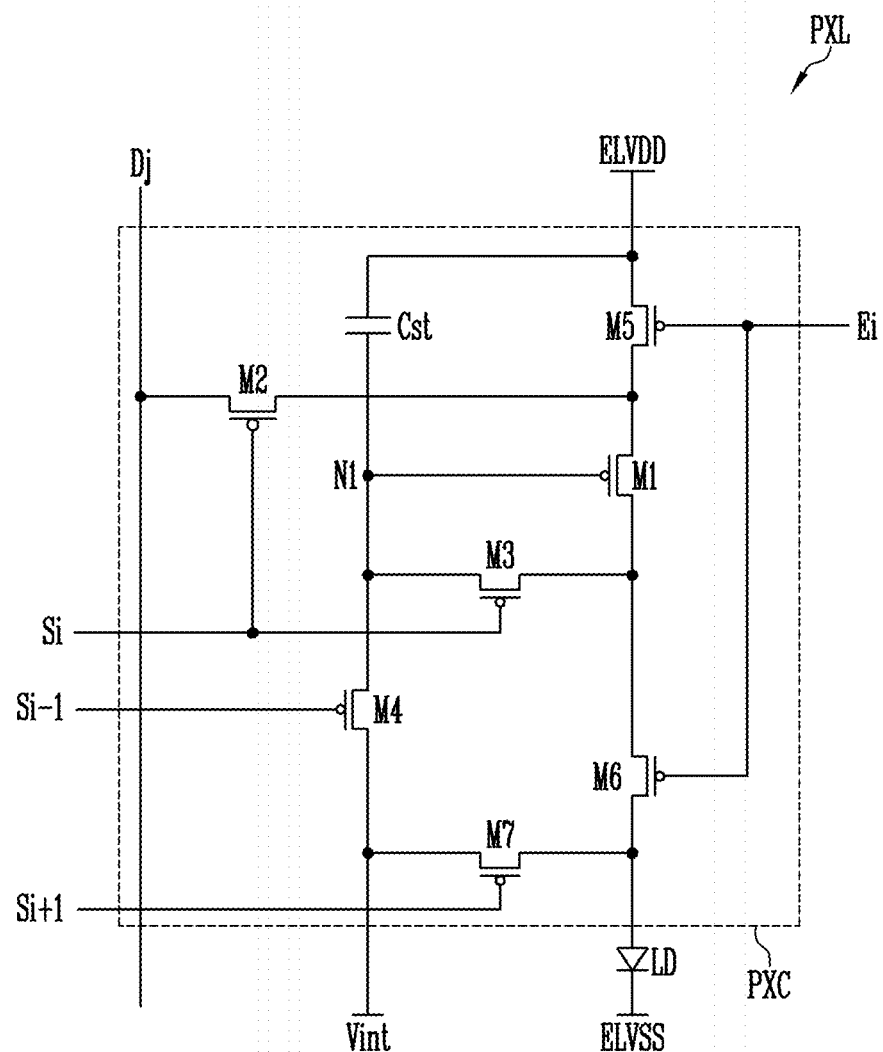
FIG. 2 is a circuit diagram illustrating an example of a pixel shown in FIG. 1.

FIG. 2 is a circuit diagram illustrating an example of the pixel shown in FIG. 1. For the convenience of description, FIG. 2 illustrates an active pixel PXL which is coupled to an i-th scan line Si (i is a natural number) disposed on an i-th horizontal pixel row, an i-th light emitting control line Ei and a j-th data line Dj (j is a natural number) disposed on a j-th vertical pixel column and includes seven transistors. However, the structure of the pixel PXL according to the present disclosure is not limited to that illustrated in FIG. 2.

Referring to FIG. 2, the pixel PXL in accordance with an exemplary embodiment of the present disclosure may include a pixel circuit PXC including first to seventh transistors M1 to M7 and a storage capacitor Cst, and a light emitting element LD.

A first electrode of the first transistor M1 (i.e., driving transistor) may be coupled to the first driving power supply ELVDD via the fifth transistor M5, and a second electrode of the first transistor M1 may be coupled to an anode electrode of the light emitting element LD via the sixth transistor M6. A gate electrode of the first transistor M1 may be coupled to a first node N1. The first transistor M1 may control, in response to the voltage of the first node N1, a current flowing from the first driving power supply ELVDD to the second driving power supply ELVSS via the light emitting element LD.

The second transistor M2 (i.e., switching transistor) may be coupled between the j-th data line Dj and the first electrode of the first transistor M1. Furthermore, a gate electrode of the second transistor M2 may be coupled to the i-th scan line Si. When a scan signal is supplied to the i-th scan line Si, the second transistor M2 may be turned on so that the first electrode of the first transistor M1 may be electrically coupled with the j-th data line Dj.

The third transistor M3 may be coupled between a second electrode of the first transistor M1 and the first node N1. A gate electrode of the third transistor M3 may be coupled to the i-th scan line Si. When a scan signal of a gate-on voltage is supplied to the i-th scan line Si, the third transistor M3 may be turned on to electrically connect the second electrode of the first transistor M1 to the first node N1. Therefore, when the third transistor M3 is turned on, the first transistor M1 may function a diode.

The fourth transistor M4 (i.e., initialization transistor) may be coupled between the first node N1 and the initialization power supply Vint. A gate electrode of the fourth transistor M4 may be coupled to the i−1-th scan line Si−1. When a scan signal is supplied to the i−1-th scan line Si−1, the fourth transistor M4 is turned on so that the voltage of the initialization power supply Vint may be supplied to the first node N1.

FIG. 2 illustrates an exemplary embodiment where the i−1-th scan line Si−1 is used as an initialization control line to initialize the gate node (i.e., the first node N1) of the first transistor M1. However, the present disclosure is not limited thereto. For example, in another exemplary embodiment of the present disclosure, other control lines (e.g., an i−2-th scan line Si−2) may be used as the initialization control line to initialize the gate node of the first transistor M1.

The fifth transistor M5 may be coupled between the first driving power supply ELVDD and the first transistor M1. A gate electrode of the fifth transistor M5 may be coupled to the i-th emission control line Ei. The fifth transistor M5 may be turned off when an emission control signal of a gate-off voltage is supplied to the i-th emission control line Ei, and may be turned on in the other cases.

The sixth transistor M6 may be coupled between the first transistor M1 and the light emitting element LD. A gate electrode of the sixth transistor M6 may be coupled to an i-th emission control line Ei. The sixth transistor M6 may be turned off when an emission control signal (e.g., a high-level voltage) of a gate-off voltage is supplied to the i-th emission control line Ei, and may be turned on in the other cases.

The seventh transistor M7 may be coupled between the initialization power supply Vint and a first electrode (e.g., the anode electrode) of the light emitting element LD. A gate electrode of the seventh transistor M7 may be coupled to an i+1-th scan line Si+1. When a scan signal of a gate-on voltage (e.g., a low-level voltage) is supplied to the i+1-th scan line Si+1, the seventh transistor M7 is turned on so that the voltage of the initialization power supply Vint may be supplied to the anode electrode of the light emitting element LD. The voltage of the initialization power supply Vint may be set to a voltage lower than that of a data signal. In other words, the voltage of the initialization power supply Vint may be set to a minimum voltage of the data signal or less.

FIG. 2 illustrates a case where the anode initialization control line to which the gate electrode of the seventh transistor M7 is coupled is the i+1-th scan line Si+1. However, the present disclosure is not limited thereto. For example, in another exemplary embodiment of the present disclosure, the gate electrode of the seventh transistor M7 may be coupled to the i-th scan line Si. In this case, when a scan signal of a gate-on voltage is supplied to the i-th scan line Si, the voltage of the initialization power supply Vint may be supplied to the anode electrode of the light emitting element LD via the seventh transistor M7.

The storage capacitor Cst may be coupled between the first driving power supply ELVDD and the first node N1. The storage capacitor Cst may store a voltage corresponding both to a data signal and the threshold voltage of the first transistor M1.

The anode electrode of the light emitting element LD may be coupled to the first transistor M1 via the sixth transistor M6, while a cathode electrode thereof may be coupled to the second driving power supply ELVSS. Such a light emitting element LD may emit light having a predetermined luminance corresponding to the current supplied from the first transistor M1. The voltage of a first driving power supply ELVDD may be set to a value higher than the voltage of the second driving power supply ELVSS so as to allow a current to flow to the light emitting element LD.

The light emitting element LD may be, for example, an organic light emitting diode. The light emitting element LD may emit light of one of red, green and blue. However, the present disclosure is not limited thereto.

The structure of the pixel PXL is not limited to the exemplary embodiment illustrated in FIG. 2. In another an exemplary embodiment, for example, various pixel circuits having known structures may be applied to the pixel PXL.

Figure 3A:
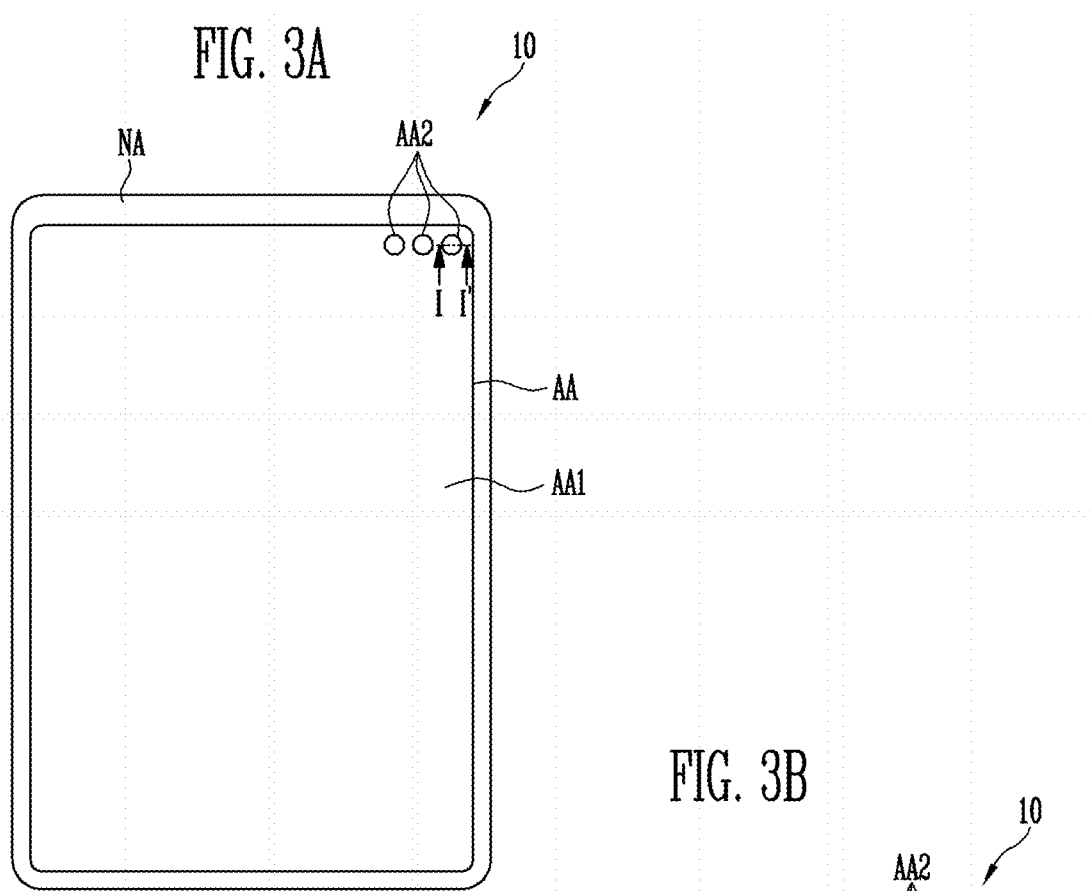
FIGS. 3A to 3C are plan views of exemplary embodiments of the display device in accordance with the present disclosure.
Figure 3B:
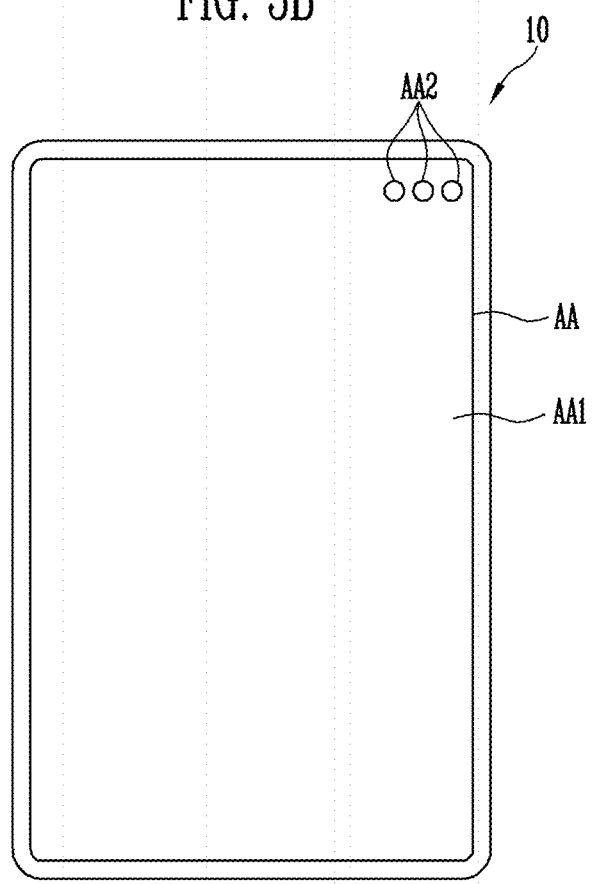
Figure 3C:
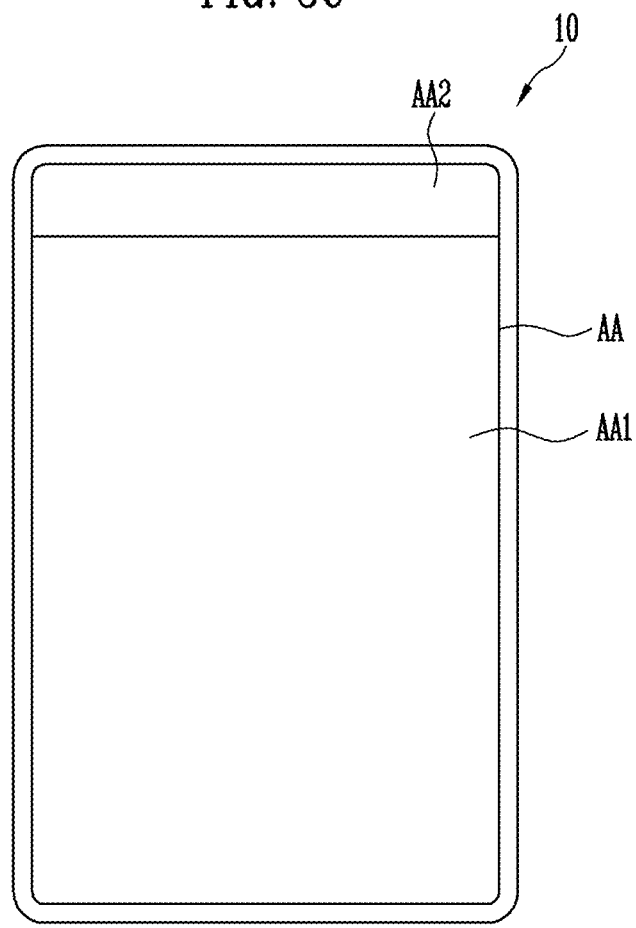

FIGS. 3A to 3C are plan views of exemplary embodiments of the display device in accordance with the present disclosure. In particular, FIGS. 3A to 3C show the front surface of the display device 10 in accordance with the present disclosure.

The display device 10 may entirely or at least partially have flexibility. For example, the display device 10 may have flexibility in the entire region thereof, or may have flexibility in a partial region corresponding to the flexible region.

Referring to FIG. 3A, the display panel 100 may be disposed on the front surface of the display device 10. The display panel 100 may include a display region AA and a non-display region NA surrounding the display region AA.

The display region AA is a region in which a plurality of pixels (or referred to as sub-pixels, see FIG. 2) is arranged, and may be referred to as an active region. In various exemplary embodiments of the present disclosure, the display region AA may be disposed in a large screen to occupy most of the front surface of the display device 10.

The non-display region NA is a region that is disposed around the display region AA, and may be provided on an edge of the front surface of the display device 10 as illustrated in FIG. 3A. The non-display region NA may be referred to as a non-active region, a bezel region or a black matrix ("BM") region. The non-display region NA may comprehensively mean regions other than the display region AA on the display panel 100.

The non-display region NA may include driving elements, wires, and various dummy regions to apply a driving signal to the display region AA. For example, in order to drive the pixels PXL in the display region AA, various wires connected to a scan driver 210, a data driver 220, an emission driver 230, a timing controller 240 and pixels PXL shown in FIG. 1 may be disposed in the non-display region NA.

In an exemplary embodiment, the display region AA may be disposed on the entire front surface of the display device 10 as illustrated in FIG. 3B. Such a display device 10 may be referred to as a full front display. As the display region AA is disposed on the entire front surface of the display device 10, the non-display region NA may not be disposed on the front surface or may be disposed in a very small area on the front surface. In such an exemplary embodiment, the display region AA may be disposed to be in contact with a side edge of the display device 10 or to be spaced apart therefrom by a distance of 1 mm or less.

Although FIGS. 3A and 3B show that the display region AA is disposed only on the front surface of the display device 10, the present disclosure is not limited thereto. That is, in another exemplary embodiment, the display region AA may be disposed at least on a region of a side edge or a region of a rear surface of the display device 10. The display regions AA may be disposed on a plurality of surfaces of the display device 10 and be provided to be at least partially connected to or separated from each other.

In various exemplary embodiments of the present disclosure, the display device 10 may include components (not shown) disposed to overlap with the display region AA. The components may be disposed under the pixels PXL and/or wires arranged in the display region AA, and may be concealed in the plan view. If the components are disposed under the display region AA to overlap therewith, the display device 10, especially its front surface, may have good appearance, and a wider display region AA may be secured.

The region that does not overlap with the components may be defined as a first display region AA1, and the region that overlaps with the components may be defined as a second display region AA2 (or sensor region). However, in various exemplary embodiments, the second display region AA2 may be set to have a region larger than a region overlapping with the components. For example, the second display region AA2 may be formed to be wide at an end of the display device 10 as illustrated in FIG. 3C. In this exemplary embodiment, the width of the first display region AA1 from the upper edge of the display device 10 may range from 5 to 8 millimeters (mm).

In another an exemplary embodiment, the second display region AA2 may be located in the display region AA, and may be surrounded by the first display region AA1 as shown in FIGS. 3A and 3B. Although FIGS. 3A and 3B show that the second display region AA2 has a substantially circular shape, the present disclosure is not limited thereto. That is, the second display region AA2 may have various shapes including a polygon such as a rectangle as illustrated in FIG. 3C, an ellipse and others.

Although FIGS. 3A to 3C illustrate that at least one second display region AA2 is disposed only on the upper end of the front surface of the display device 10, the present disclosure is not limited thereto. That is, in various exemplary embodiments, one or multiple second display region(s) AA2 may be provided, and may be disposed adjacent to or distributed in the display region AA. For example, in an exemplary embodiment where the display region AA is formed on the side edge and/or the rear surface of the display device 10, some of the second display regions AA2 may be formed in the display region AA of the side edge and/or in the display region AA of the rear surface.

The components disposed to overlap with the second display region AA2 may be optical components. That is, the components may receive or emit light. Examples of the components may include a fingerprint sensor, an image sensor, a camera, a strobe, a photo sensor, an illumination sensor, a proximity sensor, an RGB sensor, an infrared sensor, an indicator, a solar panel, etc. However, the components are not limited to the optical components, and may include various components, such as an ultrasonic sensor, a microphone, an environment sensor (e.g. barometer, hygrometer, thermometer, radioactivity sensor, thermal sensor, etc.), a chemical sensor (gas sensor, dust sensor, odor sensor, etc.) and the like.

In an exemplary embodiment, as illustrated in FIGS. 3A and 3B, each second display regions AA2 may overlap with one component. For example, one of the second display regions AA2 may overlap with the camera, another second display region AA2 may overlap with the proximity sensor, and the other second display region AA2 may overlap with the illumination sensor.

However, in another exemplary embodiment, as illustrated in FIG. 3C, one second display region AA2 may overlap with a plurality of sensors. For example, one of the second display regions AA2 may overlap with the camera and the proximity sensor arranged side by side, and the other second display region AA2 may overlap with the illumination sensor.

The second display region AA2 may transmit a signal (e.g. light) input from the outside into the components. In order to enhance the transmissivity of the signal input, the second display region AA2 may have a higher transmissivity per unit area as compared to the first display region AA1. Therefore, the second display region AA2 may transmit the signal input better than the first display region AA1. The arrangement of the pixels PXL in the first display region AA1 and the second display region AA2 will be described below in more detail with reference to the accompanying drawings.

Figure 4:
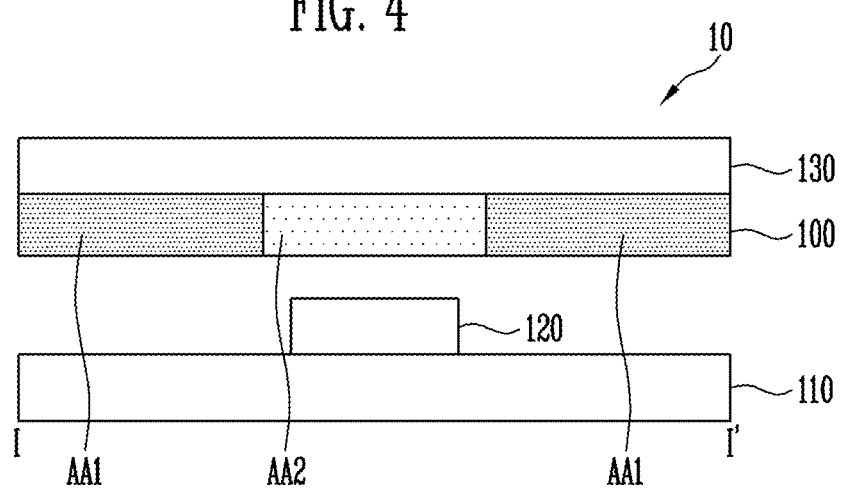
FIG. 4 is a schematic sectional view taken along line IT of FIG. 3A.

FIG. 4 is a schematic sectional view taken along line IT of FIG. 3A.

Referring to FIG. 4, the display device 10 may include a substrate 110, at least one sensor 120, a display panel 100, and a window 130. The substrate 110, the sensor 120, the display panel 100, and the window 130 may form a structure stacked in a vertical direction.

The substrate 110 may support the display panel 100 and the sensor 120. In an exemplary embodiment, the substrate 110 may be a bracket, a case or the like, and may include a plastic or metal material. The substrate 110 may form the external shape of the rear surface of the display device 10, and may protect components in the display device 10 from external stress.

The sensor 120 may be disposed on the substrate 110 in the manner of a surface mount device ("SMD"). Such a sensor 120 may be disposed between the substrate 110 and the display panel 100. The sensor 120 may face at least one region of the display panel 100, for example, the second display region AA2.

Although FIG. 4 shows an example where the sensor 120 as an example of the component is disposed on the substrate 110, the sensor 120 may be replaced with various components as described with reference to FIGS. 3A to 3C.

The display panel 100 may be a flat display panel or a flexible display panel. For example, the display panel 100 may include a rigid base layer including or formed of glass, plastics or the like, or a flexible base layer such as plastic film. The display panel 100 may display an image using the pixels disposed on the base layer. As described with reference to FIG. 2, the pixels may include a pixel circuit formed on a circuit element layer, and a light emitting element formed on a light-emitting-element layer. The light emitting element may be, for example, an organic light emitting diode. However, the light emitting element is not limited to the organic light emitting diode. In another an exemplary embodiment, for example, the light emitting element may be an inorganic light emitting element including inorganic light emitting material, or a light emitting element (e.g., a quantum dot display element) which emits light by changing the wavelength of light to be emitted using quantum dots. The display panel may display the image using the pixel circuit and the light emitting element.

The display panel 100 may include the first display region AA1 and the second display region AA2 facing the sensor 120, which are described with reference to FIGS. 3A to 3C. The pixels may be arranged in the first display region AA1 and the second display region AA2.

The first display region AA1 and the second display region AA2 may be different from each other in transmissivity per unit area. For example, the transmissivity per unit area of the second display region AA2 may be higher than the transmissivity per unit area of the first display region AA1.

In an exemplary embodiment, the pixels may be arranged at different densities in the first display region AA1 and the second display region AA2. For example, the pixels may be arranged at a first density in the first display region AA1, and the pixels may be arranged at a second density in the second display region AA2. The second density may be smaller than the first density. Here, the material and layout of the pixels in the first display region AA1 may be the same as the material and layout of the pixels in the second display region AA2.

In this regard, the density (i.e., pixel density) may be defined as the ratio (%) of the area where pixels are arranged to the total area of the corresponding display region. The area where the pixels are arranged may be the sum of the areas of the pixels. The area of the pixels may mean the area of the region including the pixel circuit and the light emitting element.

In another exemplary embodiment, the area of the pixels may mean the area of an emission surface of the light emitting element. For example, when the pixel includes the organic light emitting diode, the area of the pixel may be an area of the anode electrode exposed between pixel defining layers, or an area of an emission layer.

Alternatively, the density may be defined as a total number of pixels per unit area (e.g., Pixels per inch, "PPI") of the corresponding display region.

In the following exemplary embodiments according to the technical features of the present disclosure, the density is defined as a ratio of an area where the pixels are arranged to a total area of the corresponding display region, and the area of the pixels is defined as an area of a region including the pixel circuit and the light emitting element.

The density of the pixels in the second display region AA2 may be smaller than that in the first display region AA1. As the pixels are arranged at a relatively low density in the second display region AA2, the transmissivity of the second display region AA2 may be higher than the transmissivity of the first display region AA1.

As the density of the pixels in the second display region AA2 is lower than the density of the pixels in the first display region AA1, the image displayed in the second display region AA2 may be visually recognized as being relatively darker (i.e. lower in luminance) than the image displayed in the first display region AA1. In order to solve this problem, the pixels disposed in the second display region AA2 may be controlled to emit light at a higher luminance for the same image data.

On the other hand, in another exemplary embodiment, at least one of the material and layout of the pixels in the first display region AA1 may be different from at least one of the material and layout of the pixels in the second display region AA2. Here, the density of the pixels in the first display region AA1 may be the same as the density of the pixels in the second display region AA2.

For example, the material of the pixels in the first display region AA1 may be different from the material of the pixels in the second display region AA2. For example, the anode electrodes of the pixels in the first display region AA1 may include or be formed of reflective metal, and the anode electrodes of the pixels in the second display region AA2 may include or be formed of transmissive metal. For example, the anode electrodes of the pixels in the first display region AA1 and the second display region AA2 may include or be formed of one of the reflective metal and the transmissive metal, and a proportion of the anode electrodes formed of the transmissive metal in the second display region AA2 may be higher than a proportion of the anode electrodes formed of the transmissive metal in the first display region AA1. The light transmissivity of the transmissive metal may be higher than the light transmissivity of the reflective metal.

For example, specific wires of the pixels in the first display region AA1 may include or be formed of reflective metal, and corresponding specific wires of the pixels in the second display region AA2 may be include or formed of transmissive metal. For example, the specific wires of the pixels in the first display region AA1 and the second display region AA2 may include or be formed of one of the reflective metal and the transmissive metal, and a proportion of the specific wires formed of the transmissive metal in the second display region AA2 may be higher than a proportion of the specific wires formed of the transmissive metal in the first display region AA1.

The layout of the pixels in the first display region AA1 may be different from the layout of the pixels in the second display region AA2. For example, the area of the specific wires of the pixels in the second display region AA2 may be smaller than the area of the corresponding specific wires of the pixels in the first display region AA1. Therefore, as the distance between the specific wires in the second display region AA2 is increased, the transmissivity of the second display region AA2 may increase.

By combining the above-described exemplary embodiments with each other, at least one of the density, the material and the layout of the pixels of the second display region AA2 may be different from those of the pixels of the first display region AA1 such that the pixels of the second display region AA2 are higher in transmissivity than the pixels of the first display region AA1.

The window 130 may be disposed in the outermost portion of the display device 10. The window 130 may be made of a glass material or a synthetic resin material. The window 130 may include or be formed of a transparent material. The window 130 may be provided to protect the components disposed thereunder.

Figure 5:
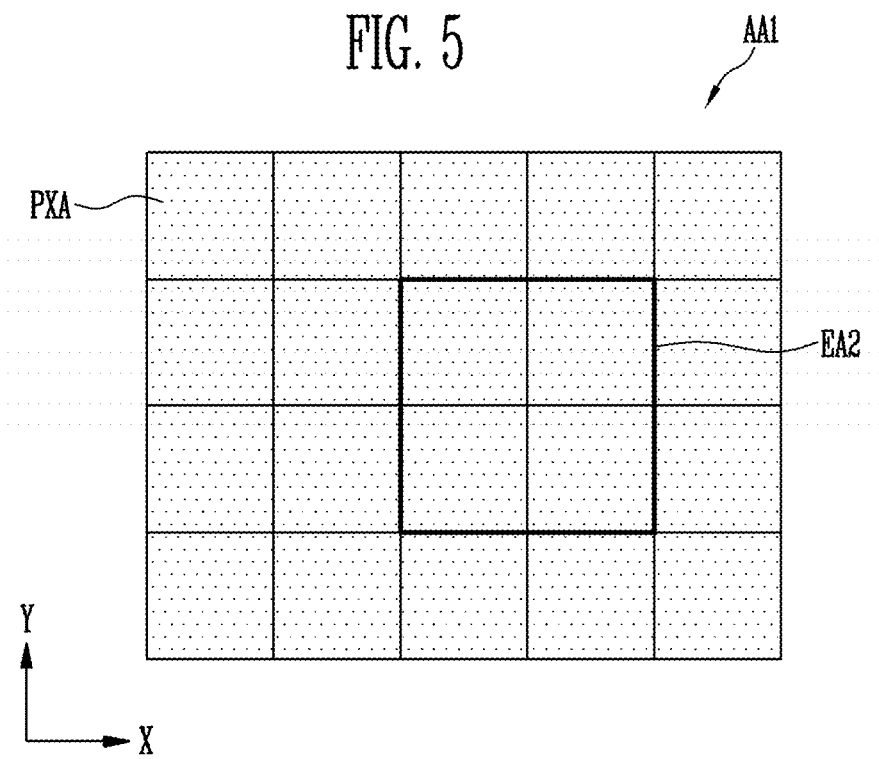
FIG. 5 is a plan view schematically illustrating an exemplary embodiment of a first display region.
Figure 6:
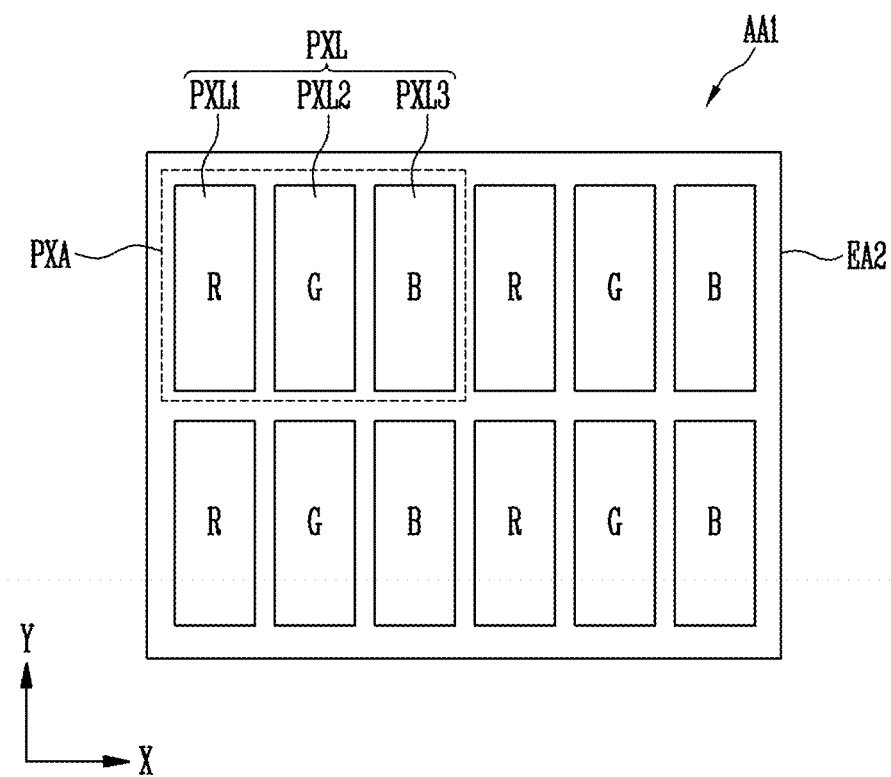
FIG. 6 is an enlarged view illustrating an exemplary embodiment of a region EA2 of FIG. 5.
Figure 7:
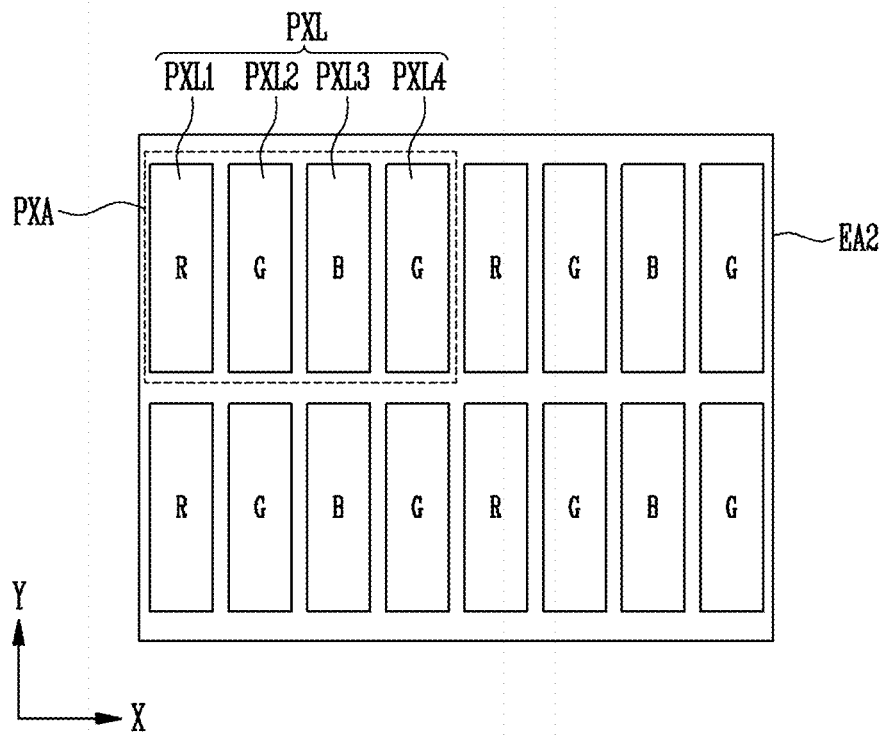
FIG. 7 is an enlarged view illustrating another exemplary embodiment of the region EA2 of FIG. 5.

FIG. 5 is a plan view schematically illustrating an exemplary embodiment of a first display region. FIG. 6 is an enlarged view illustrating an exemplary embodiment of a region EA2 of FIG. 5. FIG. 7 is an enlarged view illustrating another exemplary embodiment of the region EA2 of FIG. 5.

Referring to FIG. 5, the first display region AA1 may include unit pixel regions PXA arranged in a matrix form. The unit pixel regions PXA may be arranged in a predetermined number along a first direction X and a second direction Y according to the resolution of the display device 10 as shown in FIG. 5. The first direction X and the second direction Y may be substantially perpendicular to each other.

The unit pixel regions PXA may include pixels PXL (or sub-pixels) emitting light of the same or different color(s) as illustrated in FIGS. 6 and 7. For example, the pixels PXL may emit light of red R, green G and blue B. However, the present disclosure is not limited thereto, and the pixels PXL included in the unit pixel region PXA may emit light of various colors as long as they may implement white light by combination.

In an exemplary embodiment, the unit pixel region PXA may include first to third pixels PXL1 to PXL3 arranged in the first direction X as illustrated in FIG. 6. The first to third pixels PXL1 to PXL3 may be arranged in a stripe pattern. For example, the first pixel PXL1 may emit light of red R, the second pixel PXL2 may emit light of green G, and the third pixel PXL3 may emit light of blue B.

In another exemplary embodiment, the unit pixel region PXA may include first to fourth pixels PXL1 to PXL4 arranged in the first direction X as illustrated in FIG. 7. The first to fourth pixels PXL1 to PXL4 may be arranged in a PenTile pattern. For example, the first pixel PXL1 may emit light of red R, the second pixel PXL2 may emit light of green G, the third pixel PXL3 may emit light of blue B, and the fourth pixel PXL4 may emit light of green G.

FIGS. 6 and 7 illustrate that the pixels PXL each have a rectangular shape, but the present disclosure is not limited thereto. That is, in various exemplary embodiments, the pixels PXL may have various shapes such as a square, a rhombus, a hexagon or an octagon. Furthermore, FIGS. 6 and 7 illustrate that the pixels PXL have the same area, but the present disclosure is not limited thereto. That is, in various exemplary embodiments, among the pixels PXL, the pixels PXL emitting light (e.g. red R light and/or blue B light) of a certain color may have an area larger than that of other pixels PXL.

As illustrated in FIGS. 5 to 7, in the unit pixel regions PXA, the pixels PXL are arranged at a first density in the first display region AA1. For example, the first density may be set such that the pixels PXL are compactly arranged in the first display region AA1 and thus the total area of the first display region AA1 is substantially equal to an area where the pixels PXL are arranged. For example, the first density may be approximately 100%.

Figure 8:
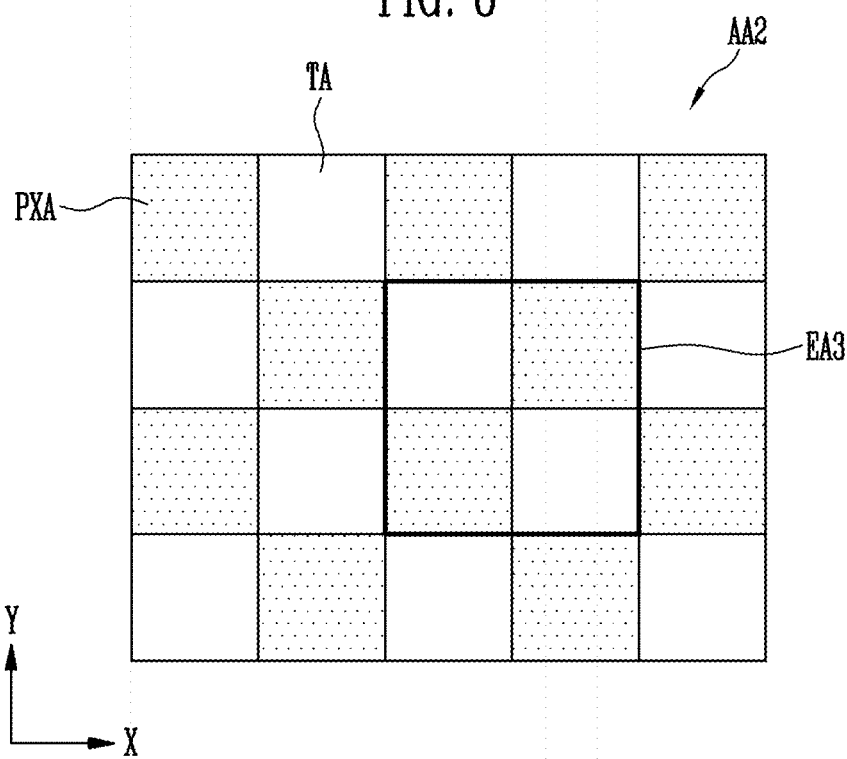
FIG. 8 is a plan view schematically illustrating an exemplary embodiment of a second display region.
Figure 9:
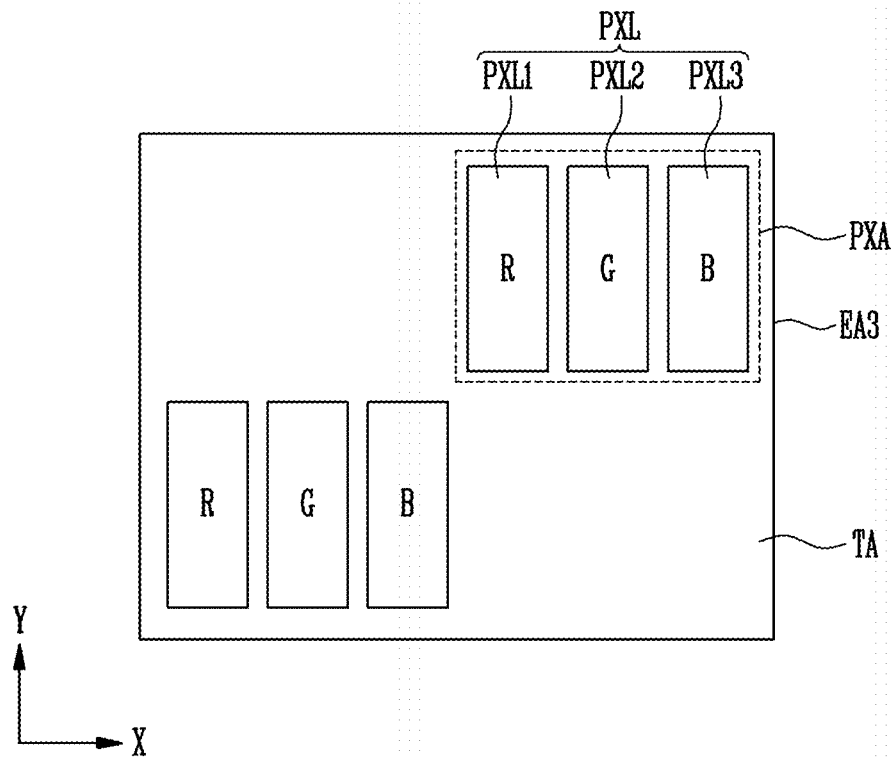
FIG. 9 is an enlarged view illustrating an exemplary embodiment of a region EA3 of FIG. 8.
Figure 10:
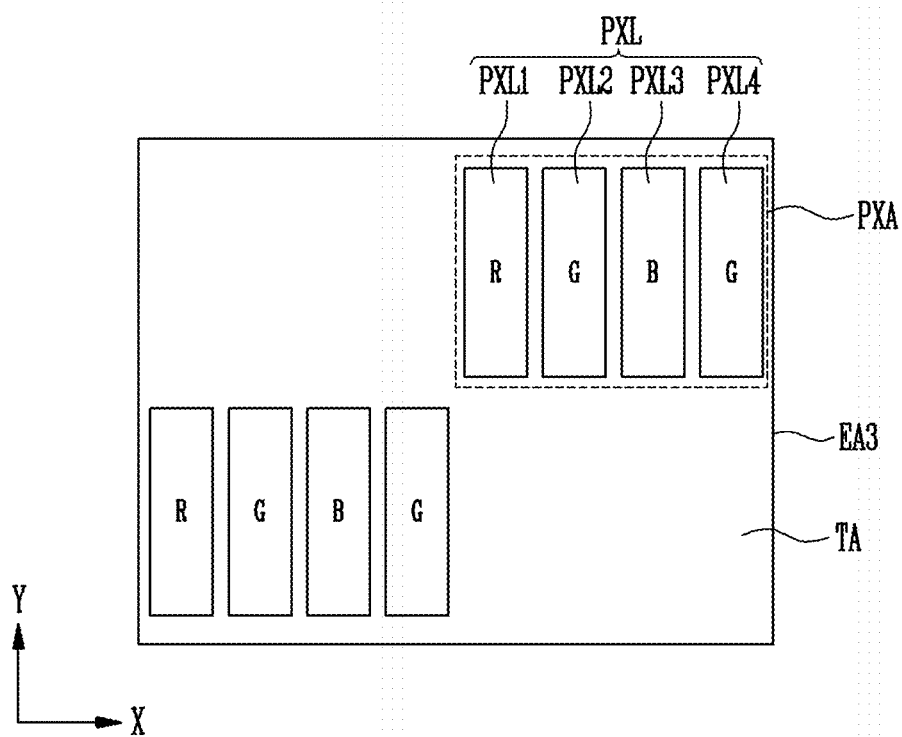
FIG. 10 is an enlarged view illustrating another exemplary embodiment of the region EA3 of FIG. 8.
Figure 11:
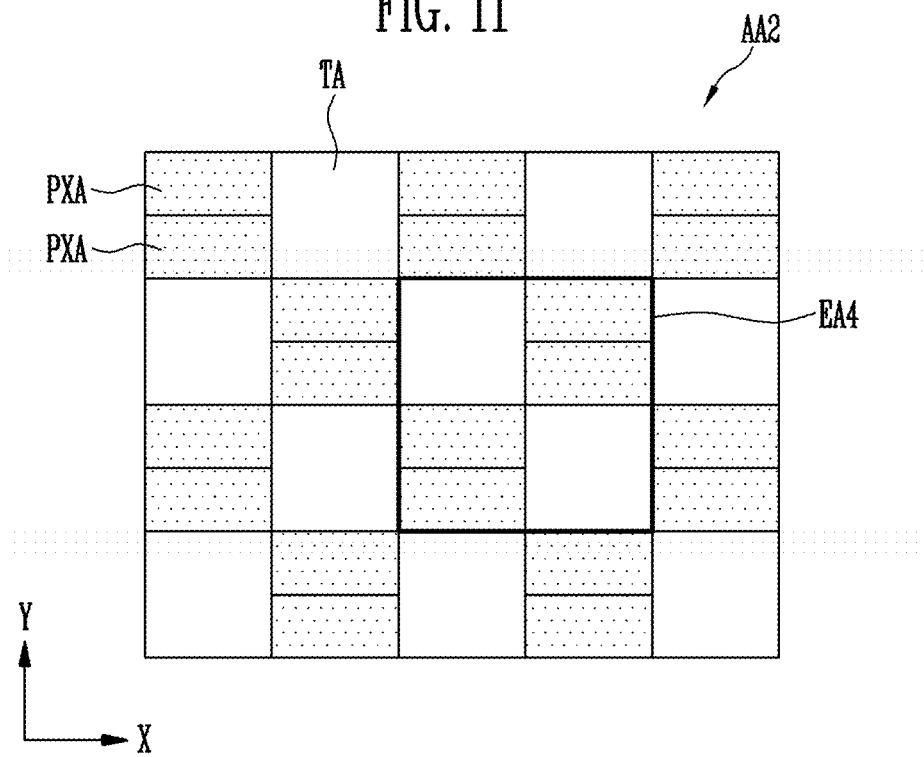
FIG. 11 is a plan view schematically illustrating another exemplary embodiment of a second display region.
Figure 12:
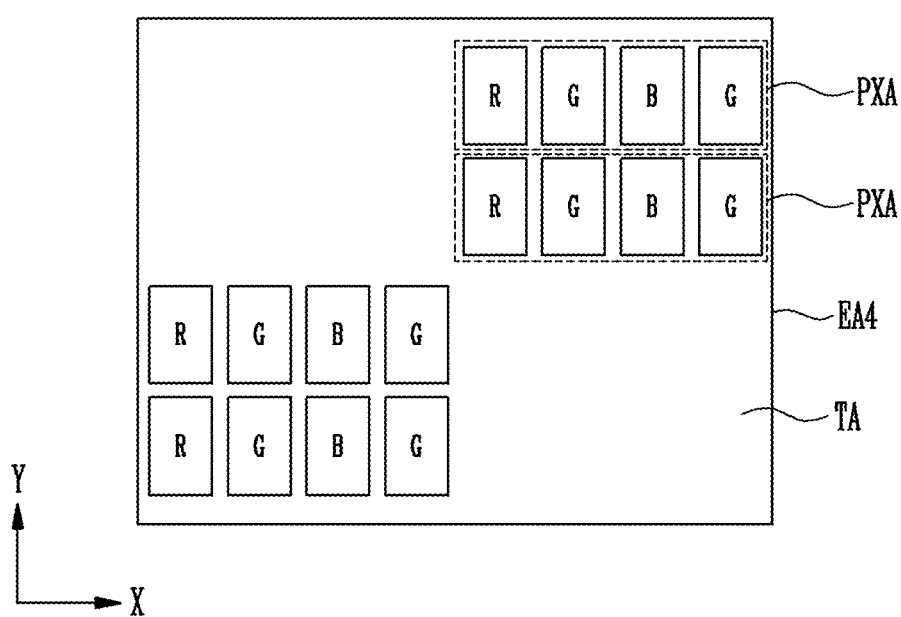
FIG. 12 is an enlarged view illustrating an exemplary embodiment of a region EA4 of FIG. 11.

FIG. 8 is a plan view schematically illustrating an exemplary embodiment of the second display region. FIG. 9 is an enlarged view illustrating an exemplary embodiment of a region EA3 of FIG. 8. FIG. 10 is an enlarged view illustrating another exemplary embodiment of the region EA3 of FIG. 8. FIG. 11 is a plan view schematically illustrating another exemplary embodiment of the second display region. FIG. 12 is an enlarged view illustrating an exemplary embodiment of a region EA4 of FIG. 11.

Referring to FIGS. 8 and 11, the second display region AA2 may include unit pixel regions PXA and transmissive regions TA arranged in a matrix from. The unit pixel regions PXA and the transmissive regions TA are alternately arranged in the first direction X. Furthermore, the unit pixel regions PXA and the transmissive regions TA are alternately arranged in the second direction Y. The first direction X and the second direction Y may be substantially perpendicular to each other.

In an exemplary embodiment, as illustrated in FIGS. 8 to 10, one unit pixel region PXA and one transmissive region TA may be alternately arranged in the first direction X and the second direction Y. In another exemplary embodiment, as illustrated in FIGS. 11 and 12, a plurality of unit pixel regions PXA and one transmissive region TA may be alternately arranged, or one unit pixel region PXA and a plurality of transmissive regions TA may be alternately arranged in either of the first direction X and the second direction Y. FIGS. 11 and 12 illustrate an exemplary embodiment where one unit pixel region PXA and one transmissive region TA are alternately arranged in the first direction X, and two unit pixel regions PXA and one transmissive region TA are alternately arranged in the second direction Y, but the present disclosure is not limited thereto.

The unit pixel regions PXA may include pixels PXL (or sub-pixels) emitting light of the same or different color(s) as illustrated in FIGS. 9, 10, and 12. For example, the pixels PXL may emit light of red R, green G and blue B. However, the present disclosure is not limited thereto, and the pixels PXL included in the unit pixel region PXA may emit light of various colors as long as they may implement white light by combination.

In an exemplary embodiment, the unit pixel region PXA may include first to third pixels PXL1 to PXL3 arranged in the first direction X as illustrated in FIG. 9. The first to third pixels PXL1 to PXL3 may be arranged in a stripe pattern. For example, the first pixel PXL1 may emit light of red R, the second pixel PXL2 may emit light of green G, and the third pixel PXL3 may emit light of blue B.

In another exemplary embodiment, the unit pixel region PXA may include first to fourth pixels PXL1 to PXL4 arranged in the first direction X as illustrated in FIG. 10. The first to fourth pixels PXL1 to PXL4 may be arranged in a PenTile pattern. For example, the first pixel PXL1 may emit light of red R, the second pixel PXL2 may emit light of green G, the third pixel PXL3 may emit light of blue B, and the fourth pixel PXL4 may emit light of green G.

FIGS. 9 and 10 illustrate that the pixels PXL each have a rectangular shape, but the present disclosure is not limited thereto. That is, in various exemplary embodiments, the pixels PXL may have various shapes such as a square, a rhombus, a hexagon or an octagon. Furthermore, FIGS. 9 and 10 illustrate that the pixels PXL have the same area, but the present disclosure is not limited thereto. That is, in various exemplary embodiments, among the pixels PXL, the pixels PXL that emit light (e.g. red R light and/or blue B light) of a certain color may have an area larger than that of other pixels PXL.

The transmissive region TA may be a transparent window in which no pixel PXL is disposed. In other words, the transmissive region TA may be a region where a light emitting element and circuit elements forming the pixel PXL do not exist. Since the circuit elements and the light emitting element do not exist in the transmissive region TA, only a transparent insulation layer which would be provided between the circuit elements or between the circuit element and the light emitting element in the unit pixel regions PXA may be disposed without the circuit elements and the light emitting element in the transmissive region TA.

In an exemplary embodiment, some of the electrodes constituting the circuit elements and the light emitting element are formed of transparent electrodes, and the others are formed of opaque electrodes. In this exemplary embodiment, the transmissive region TA may be a region where the opaque electrode does not exist. For example, the transmissive region TA may be a region where the opaque electrode (e.g. a drain electrode illustrated in FIG. 2) of the organic light emitting diode constituting the pixels PXL and an emission layer do not exist. Alternatively, the transmissive region TA may be a region where the opaque electrodes constituting the circuit elements also do not exist. However, the present disclosure is not limited thereto.

As illustrated in FIGS. 8 to 12, the unit pixel regions PXA are arranged at a second density in the second display region AA2. The second density may be a ratio of an area of the second display region AA2 excluding the area where transmissive regions TA are arranged to the total area of the second display region AA2.

The second density is smaller than the first density that is the density of the pixels PXL arranged in the first display region AA1. In exemplary embodiments of FIGS. 10 to 12, the second density may be about 50%. However, the present disclosure is not limited thereto.

As the density of the pixels PXL in the second display region AA2 is lower than the density of the pixels PXL in the first display region AA1, the image displayed in the second display region AA2 may be visually recognized as being relatively darker (i.e. lower in luminance) than the image displayed in the first display region AA1. In order to solve this problem, the pixels PXL disposed in the second display region AA2 may be controlled to emit light at a higher luminance with respect to the same image data. For example, the pixels PXL disposed in the first display region AA1 are controlled to emit light at a first luminance, while the pixels PXL disposed in the second display region AA2 are controlled to emit light at a second luminance. Here, the second luminance may be higher than the first luminance.

In an exemplary embodiment, if the first density is about 100% and the second density is about 50%, the second luminance may be about twice as high as the first luminance. However, the present disclosure is not limited thereto.

The significant change in density and luminance of the pixels PXL between the first display region AA1 and the second display region AA2 may be recognized by a viewer of the display device 10 as the discontinuity of an image. According to the present disclosure, in order to reduce the visibility of the image discontinuity, the light emission of the pixels PXL in a portion (hereinafter, "third display region") of the first display region AA1 adjacent to the second display region AA2 may be adjusted. Hereinafter, the technical feature of the present disclosure will be described in more detail.

Figure 13:
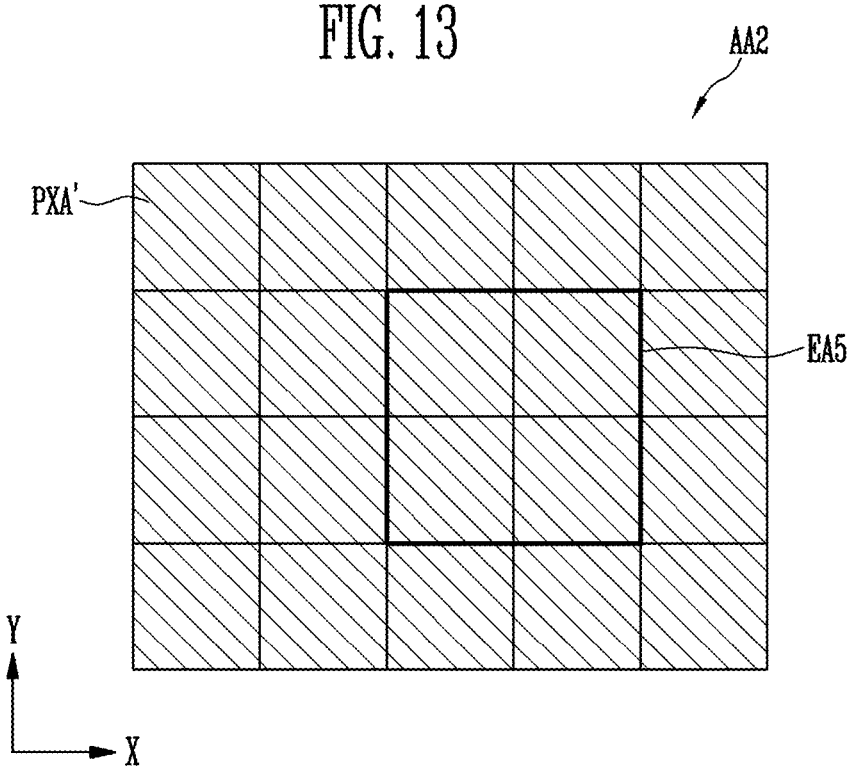
FIG. 13 is a plan view schematically illustrating still another exemplary embodiment of a second display region.
Figure 14:
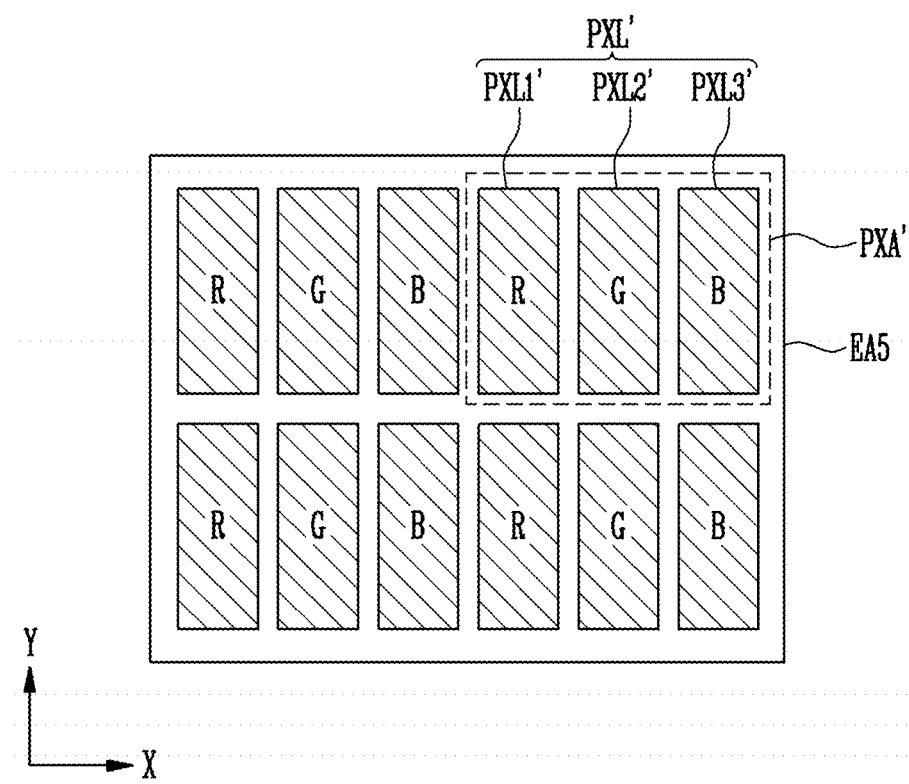
FIG. 14 is an exemplary enlarged view of a region EA5 of FIG. 13.

FIG. 13 is a plan view schematically illustrating still another exemplary embodiment of the second display region. FIG. 14 is an exemplary enlarged view of a region EA5 of FIG. 13.

Referring to FIG. 13, the second display region AA2 may include unit pixel regions PXA' arranged in a matrix form. Here, the second display region AA2 may include no transmissive region. As described above, at least one of the material and layout of the pixels in the first display region AA1 may be different from at least one of the material and layout of the pixels in the second display region AA2.

For example, referring to FIG. 14, anode electrodes of pixels PXL1', PXL2', and PXL3' of the unit pixel region PXA' in the second display region AA2 may include or be formed of transmissive metal. Here, the anode electrodes of the pixels PXL1, PXL2, and PXL3 of the first display region AA1 may include or be formed of reflective metal (see FIG. 6). Therefore, even if the second display region AA2 has no transmissive region and the density of the pixels PXL' in the second display region AA2 is equal to the density of the pixels PXL in the first display region AA1, the transmissivity of the second display region AA2 may be higher than the transmissivity of the first display region AA1.

Figure 15A:
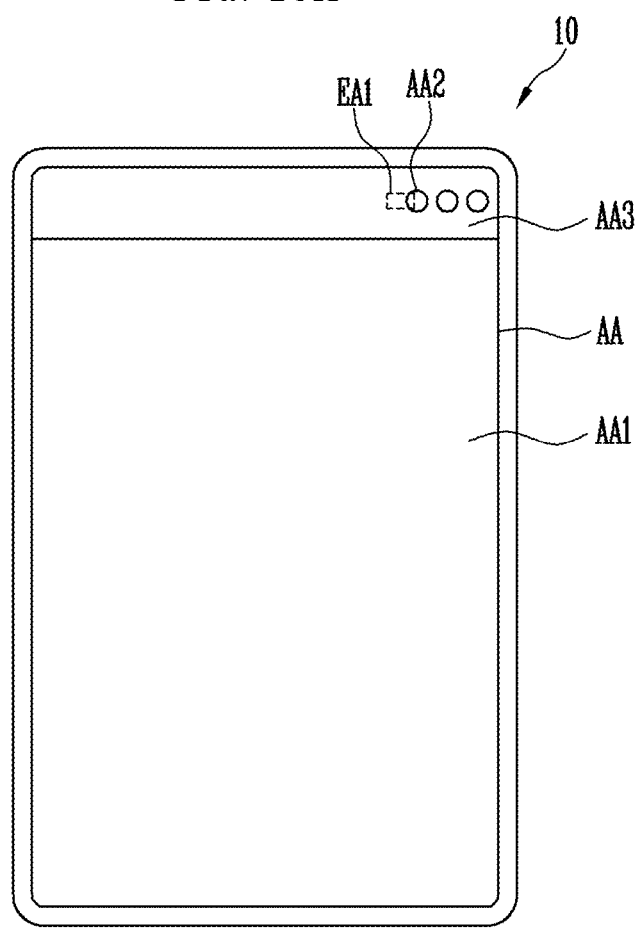
FIGS. 15A to 15C are plan views illustrating various exemplary embodiments of a third display region.
Figure 15B:
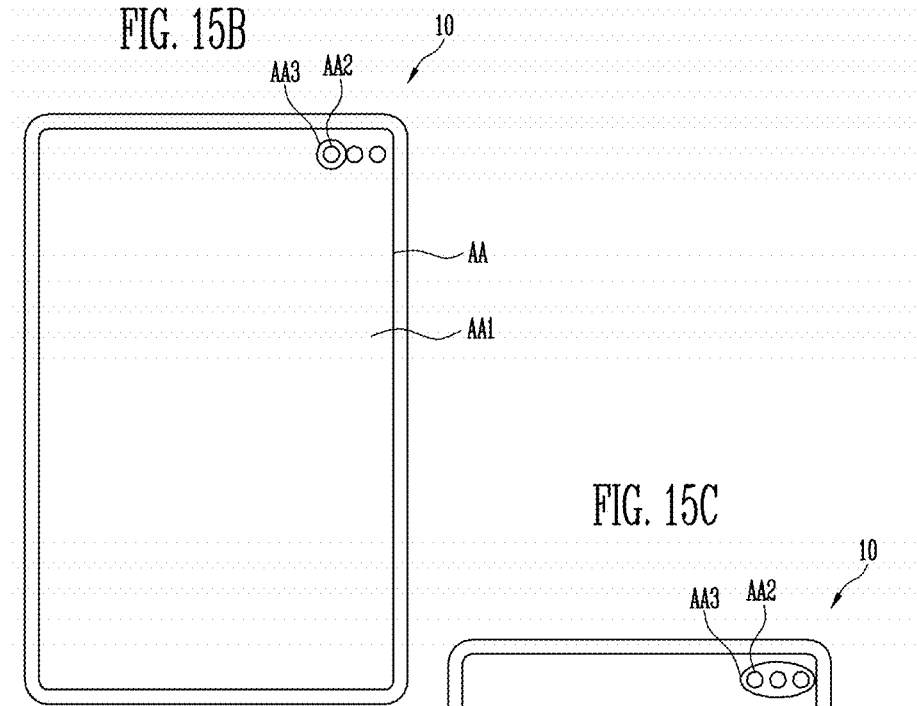
Figure 15C:
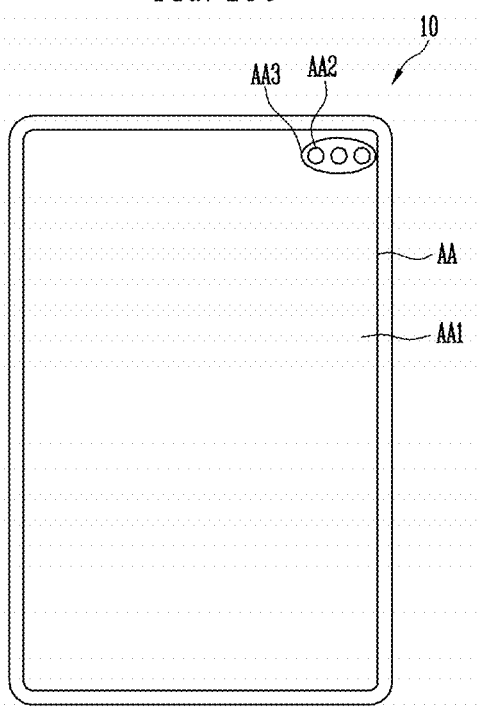

FIGS. 15A to 15C are plan views illustrating various exemplary embodiments of a third display region.

Referring to FIGS. 15A to 15C, a third display region AA3 may be further provided between the first display region AA1 and the second display region AA2. Such a third display region AA3 may surround the second display region AA2 and contact with the first display region AA1.

The third display region AA3 may surround the second display region AA2, and may be provided on a side of the display region AA. For example, as illustrated in FIG. 15A, the third display region AA3 may surround the second display region AA2 disposed on an upper end of the display region AA, and thus may be provided on the upper end of the display region AA. In this exemplary embodiment, the width of the third display region AA3 from the upper edge of the display device 10 may range from 5 to 8 mm.

In another exemplary embodiment, the third display region AA3 may be a region that surrounds the second display region AA2 and is surrounded by the first display region AA1. For example, the third display region AA3 may surround one second display region AA2 as illustrated in FIG. 15B, or may surround a plurality of second display regions AA2 as illustrated in FIG. 15C.

In an exemplary embodiment illustrated in FIG. 15B, the third display region AA3 may have the shape of a circle, an ellipse, a rectangle, a polygon or the like to correspond to the shape of the second display region AA2. Furthermore, a plurality of third display regions AA3 may be provided to correspond to the number of the second display regions AA2 so that each of the third display regions AA3 surrounds each of the second display region AA2.

The unit pixel regions PXA may be disposed in the third display region AA3 at the same density as that of the first display region AA1. In other words, referring to the above-described exemplary embodiments, the pixels PXL may be disposed in the third display region AA3 at the first density. If the pixels PXL are disposed in the third display region AA3 at the same density as the first display region AA1, there is no difference in reflectance due to a difference in pixel density between the first display region AA1 and the third display region AA3, so that the boundary visibility can be improved.

However, the present disclosure is not limited thereto. In various exemplary embodiments, the unit pixel regions PXA may be disposed in the third display region AA3 at a density that is larger than that of the second display region AA2 and is smaller than that of the first display region AA1. Alternatively, in various exemplary embodiments, the pixels PXL may be disposed in the third display region AA3 in a direction from the second display region AA2 to the first display region AA1 such that the density of the pixels PXL in the third display region AA3 is gradually changed from the second density to the first density. Hereinafter, the present disclosure will be described by taking an example in which the pixels PXL are disposed in the third display region AA3 at the first density that is the same as the first display region AA1.

In order to improve the visibility of a boundary surface between the first display region AA1 and the second display region AA2, the luminance of the pixels PXL disposed in the third display region AA3 can be controlled. For example, when the pixels PXL of the first display region AA1 are controlled to emit light at the first luminance and the pixels PXL of the second display region AA2 are controlled to emit light at the second luminance, only at least some of the pixels PXL disposed in the third display region AA3 may emit light and may be controlled to emit light at the second luminance.

Hereinafter, a method of controlling the luminance of the pixels PXL disposed in the third display region AA3 will be described in more detail.

Figure 16:
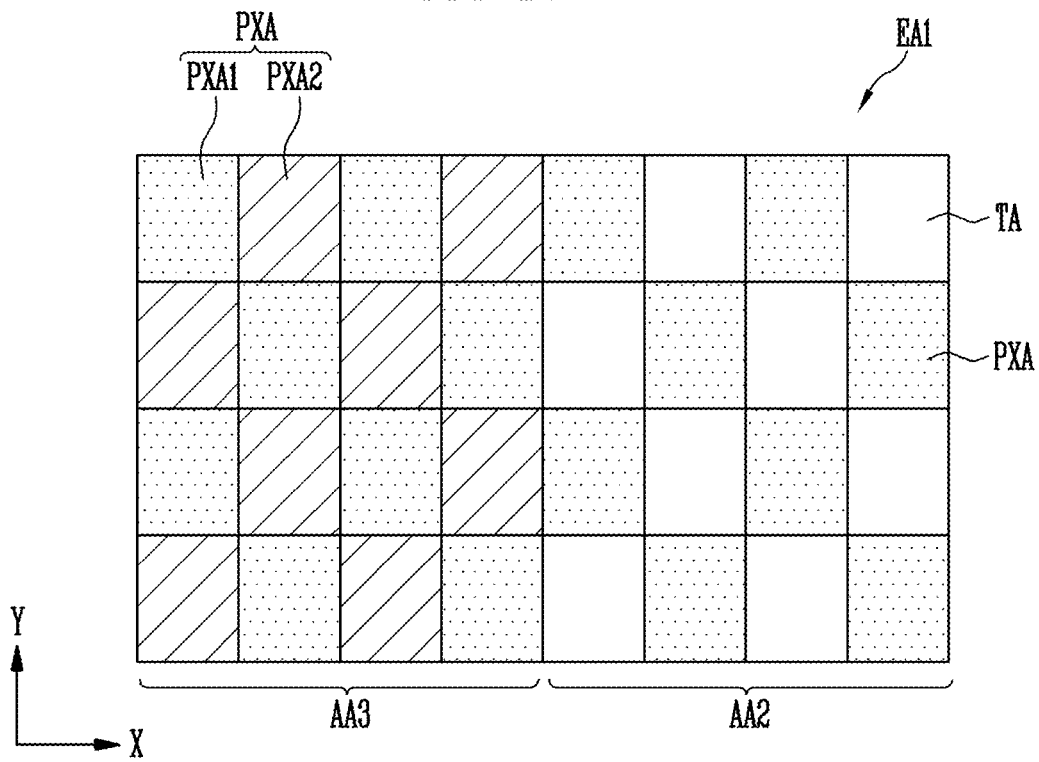
FIG. 16 is an enlarged view of a region EA1 of FIG. 15A.
Figure 17:
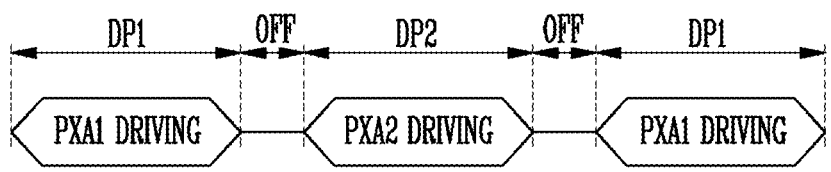
FIG. 17 is a timing diagram illustrating an exemplary embodiment of a method of driving the third display region in accordance with the present disclosure.

FIG. 16 is an enlarged view of a region EA1 of FIG. 15A. FIG. 17 is a timing diagram illustrating an exemplary embodiment of a method of driving the third display region in accordance with the present disclosure.

Referring to FIG. 16, the third display region AA3 includes a first group of unit pixel regions PXA1 and a second group of unit pixel regions PXA2. The first group of unit pixel regions PXA1 and the second group of unit pixel regions PXA2 are alternately arranged in the first direction X and the second direction Y. Adjacent first group of unit pixel regions PXA1 and second group of unit pixel regions PXA2 may make a pair.

In an exemplary embodiment, the first group of unit pixel regions PXA1 and the second group of unit pixel regions PXA2 may be controlled such that only one group of the first and second groups emits light during one display period DP. For example, the first group of unit pixel regions PXA1 emits light to display an image during a first display period DP1. As described above, the first group of unit pixel regions PXA1 may emit light at the second luminance that is higher than that of the first display region AA1 and is the same as that of the second display region AA2.

Subsequently, the second group of unit pixel regions PXA2 emits light to display an image during a second display period DP2. Likewise, the second group of unit pixel regions PXA2 may emit light at the second luminance.

As illustrated in FIG. 17, the first display period DP1 and the second display period DP2 may be periods separated by an off period OFF when the display panel 100 does not display an image. The off period OFF may be a period controlled such that the display panel 100 does not display the image by a user input button or the like provided on the display device 10, for example. Alternatively, the off period OFF may be a period in which the power of the display device 10 itself is turned off so that no power is applied to the display panel 100.

However, the present disclosure is not limited thereto. That is, in various exemplary embodiments, each of the first display period DP1 and the second display period DP2 may be a driving period within one frame.

The third display region AA3 is described as having the two groups of unit pixel regions in the above-described exemplary embodiments, but the present disclosure is not limited thereto. That is, in various exemplary embodiments, the third display region AA3 may have a larger number of groups of unit pixel regions. In such an exemplary embodiment, respective groups of unit pixel regions may sequentially alternate with each other to emit light.

The number of the groups of the unit pixel regions forming the third display region AA3 may be determined to correspond to the pixel density of the second display region AA2. For example, the number of the unit pixel regions included in each group in the third display region AA3 may correspond to the number of the unit pixel regions disposed in the second display region AA2.

In the present disclosure, since the third display region AA3 physically has the same pixel density as the first display region AA1, a difference in reflectance between the first display region AA1 and the third display region AA3 is not visually recognized. On the other hand, since the third display region AA3 is configured to have the same transmissivity as the first display region AA1, a difference in reflectance between the first display region AA1 and the third display region AA3 may not be visually recognized. For example, the pixels of the third display region AA3 and the first display region AA1 may have the same material and layout.

In terms of driving, the third display region AA3 is controlled such that the unit pixel regions PXA of the same number as the second display regions AA2 emit light at the same luminance as the second display region AA2. Thus, the boundary visibility between the second display region AA2 and the third display region AA3 may be improved. In this case, the unit pixel regions PXA emitting light in the third display region AA3 are arranged in the same shape as the unit pixel regions PXA arranged in the second display region AA2. Thus, the boundary visibility between the second display region AA2 and the third display region AA3 may be further improved.

According to the present disclosure, the third display region AA3 is controlled to emit light at a higher luminance than the first display region AA1. The number of the unit pixel regions PXA emitting light in the third display region AA3 is smaller than that in the first display region AA1, but the luminance of the unit pixel regions PXA emitting light in the third display region AA3 is increased compared to the luminance of the unit pixel regions PXA emitting light in the first display region AA1. Thus, the boundary visibility between the first display region AA1 and the third display region AA3 may be improved. That is, a significant change in luminance between the first display region AA1 and the third display region AA3 is reduced. By controlling such that the first group of unit pixel regions PXA1 and the second group of unit pixel regions PXA2 alternately emit light, damage to pixels PXL included in each unit pixel region PXA may be effectively prevented.

Figure 18:
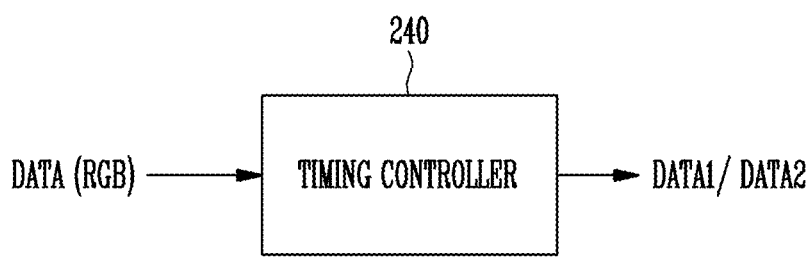
FIG. 18 is a diagram illustrating an exemplary embodiment of the operation of a timing controller of FIG. 1.

FIG. 18 is a diagram illustrating an exemplary embodiment of the operation of the timing controller of FIG. 1.

Referring to FIG. 18, the timing controller 240 receives image data DATA from an external device. The image data DATA may be RGB values for the image that is to be displayed on the display region AA. To be more specific, the image data DATA may be RGB values for each of the unit pixel regions PXA included in the display region AA. In an exemplary embodiment, the image data DATA includes RGB values for the second display region AA2 from which some of the unit pixel regions PXA are omitted. The image data DATA may also include RGB values corresponding to each of the transmissive regions TA.

The timing controller 240 may correct the image data DATA based on a region where the RGB values included in the image data DATA are to be displayed. For example, when a certain RGB value corresponds to the transmissive region TA of the second display region AA2, the timing controller 240 may remove a corresponding RGB value or convert it to a dummy value. For example, when the certain RGB value corresponds to the unit pixel region PXA of the second display region AA2, the timing controller 240 may correct the image data DATA such that luminance is changed in the corresponding unit pixel region PXA. For example, the timing controller 240 may correct the image data DATA such that the luminance is increased in the corresponding unit pixel region PXA.

If a certain RGB value corresponds to the first display region AA1, the timing controller 240 may not correct the corresponding RGB value. If the certain RGB value corresponds to the third display region AA3, the timing controller 240 may select a group of the unit pixel regions PXA on which the image is to be displayed during a current display period. The timing controller 240 may correct the luminance of the image data DATA on each of the unit pixel regions PXA of the selected group. For example, the timing controller 240 may correct the image data DATA such that the luminance is increased in the unit pixel regions PXA of the selected group. On the other hand, the timing controller 240 may remove the image data DATA on each of the unit pixel regions PXA of a group which is not selected, or may covert the image data into the dummy value.

The timing controller 240 may output the image data DATA1 or DATA2 corrected as such to the data driver 220 shown in FIG. 1.

According to exemplary embodiments of the present disclosure, a display device can reduce the discontinuity of an image at a boundary between a sensor region and a display region, and can improve a user's visibility for an image.

It will be understood to those skilled in the art that the present disclosure may be implemented in different specific forms without changing the technical ideas or essential characteristics. Therefore, it should be understood that the exemplary embodiments are only for illustrative purposes and do not limit the bounds of the present disclosure. It is intended that the bounds of the present disclosure are defined by the accompanying claims, and various modifications, additions and substitutions, which can be derived from the meaning, scope and equivalent concepts of the accompanying claims, fall within the bounds of the present disclosure.

What is claimed is:

1. A display device comprising:
a substrate;
a display panel including a first display region having first pixels, a second display region having second pixels, and a third display region located between the first and second display regions and having third pixels; and
a light sensor disposed between the substrate and the display panel and which overlaps the second display region and does not overlap the first and third display regions in a plan view,
wherein the third display region does not have any light sensors, and
wherein the first and third pixels have the same material and layout and are disposed at a first density in the first display region and the third display region, respectively, and the second pixels are disposed at a second density smaller than the first density in the second display region,
the third display region surrounds an entirety of the second display region,
the third display region comprises a first group of unit pixel regions and a second group of unit pixel regions arranged to alternate with each other,
the first group of unit pixel regions is controlled to emit light during a first display period and the second group of unit pixel regions is controlled to emit light during a second display period, and
the first display period and the second display period are alternately repeated.

2. The display device according to claim 1, wherein the second display region comprises:
second unit pixel regions, each being composed of at least one of the second pixels; and
transmissive regions arranged to alternate with the second unit pixel regions, no second pixel being disposed in the transmissive regions.

3. The display device according to claim 1, wherein the first display period and the second display period are separated by an off period during which the display panel is turned off.

4. The display device according to claim 1, wherein each of the first display period and the second display period is a period constituting one frame.

5. The display device according to claim 1, wherein the first pixels are controlled to emit light at a first luminance, and the second pixels and the third pixels are controlled to emit light at a second luminance.

6. A method of controlling a display device including a substrate, a display panel including a first display region having first pixels, a second display region having second pixels, and a third display region located between the first and second display regions and having third pixels, and a light sensor disposed between the substrate and the display panel to overlap the second display region and not to overlap the first and third display regions, the method comprising:
receiving image data;
determining a region on which the image data is to be displayed;
correcting the image data; and
providing the corrected image data to a corresponding display region,
wherein the correcting of the image data comprises:
correcting the image data such that a first group of unit pixel regions of the third display region emits light during a first display period; and
correcting the image data such that a second group of unit pixel regions of the third display region emits light during a second display period subsequent to the first display period,
wherein the third display region does not have any light sensors, and
wherein the third display region surrounds an entirety of the second display region, the first and third pixels have the same material and layout,
the first group of unit pixel regions and the second group of unit pixel regions are arranged to alternate with each other, and
the first display period and the second display period are alternately repeated.

7. The method according to claim 6, wherein the second display region comprises:
second unit pixel regions, each being composed of at least one of the second pixels; and
transmissive regions arranged to alternate with the second unit pixel regions, no second pixel being disposed in the transmissive regions.

8. The method according to claim 6, wherein the first display period and the second display period are separated by an off period during which the display panel is turned off.

9. The method according to claim 6, wherein each of the first display period and the second display period is a period constituting one frame.

10. The method according to claim 6, wherein the correcting of the image data further comprises:
correcting the image data such that the first pixels emit light at a first luminance for the image data to be displayed on the first display region; and
correcting the image data such that the second pixels emit light at a second luminance for the image data to be displayed on the second display region and the third pixels emit light at the second luminance for the image data to be displayed on the third display region.

11. A display device comprising:
a substrate;
a display panel including a first display region having first pixels, a second display region having second pixels, and a third display region located between the first and second display regions and having third pixels; and
a light sensor disposed between the substrate and the display panel and which overlaps the second display region and does not overlap the first and third display regions in a plan view,
wherein the third display region does not have any light sensors, and
wherein transmissivity of the second display region is higher than transmissivity of the first display region,
the transmissivity, a material, and a layout of the first display region is equal to transmissivity, a material, and a layout of the third display region,
the third display region surrounds an entirety of the second display region,
the third display region comprises a first group of unit pixel regions and a second group of unit pixel regions arranged to alternate with each other,
the first group of unit pixel regions is controlled to emit light during a first display period and the second group of unit pixel regions is controlled to emit light during a second display period, and
the first display period and the second display period are alternately repeated.

* * * * *